US005516622A

United States Patent [19]

Savini et al.

[11] Patent Number: 5,516,622

[45] Date of Patent: May 14, 1996

[54] ELEMENT AND PROCESS FOR LASER-INDUCED ABLATIVE TRANSFER UTILIZING PARTICULATE FILLER

[75] Inventors: Steven Savini, New Castle; Reid E. Kellogg, Wilmington, both of Del.; Gregory C. Weed, Towanda, Pa.

[73] Assignee: E. I. Du Pont de Nemours and Company, Wilmington, Del.

[21] Appl. No.: 542,748

[22] Filed: Oct. 13, 1995

Related U.S. Application Data

[63] Continuation of Ser. No. 233,840, Apr. 26, 1994, abandoned.

[51] Int. Cl.[6] ........ G03F 7/34

[52] U.S. Cl. ........ 430/200; 430/252; 430/253; 430/278.1; 430/945

[58] Field of Search ........ 430/200, 252, 430/253, 278.1, 945

[56] References Cited

U.S. PATENT DOCUMENTS

| | | | |
|---|---|---|---|
| 4,541,830 | 9/1985 | Hotta et al. . | |
| 4,643,917 | 2/1987 | Koshizuka et al. | 427/256 |
| 4,772,582 | 9/1988 | DeBoer | 503/227 |
| 4,942,141 | 7/1990 | DeBoer | 503/227 |
| 4,948,776 | 8/1990 | Evans et al. | 503/227 |
| 5,019,549 | 5/1991 | Kellogg et al. | 503/227 |
| 5,156,938 | 10/1992 | Foley et al. | 430/200 |
| 5,171,650 | 12/1992 | Ellis et al. | 430/20 |
| 5,254,524 | 10/1993 | Guittard et al. | 503/227 |

FOREIGN PATENT DOCUMENTS

| | | |
|---|---|---|
| 0544284 | 6/1993 | European Pat. Off. . |
| 2083726 | 3/1982 | United Kingdom . |

*Primary Examiner*—Charles L. Bowers, Jr.
*Assistant Examiner*—Christopher G. Young

[57] ABSTRACT

An element for use in a laser induced ablative transfer process, said element comprising a support bearing on a first surface thereof at least one coating comprising (i) a non-sublimable imageable component, (ii) a laser radiation absorbing component, (iii) a particular filler having an average particle size (S), and (iv) optionally a binder, wherein the non-sublimable imageable component and the laser radiation absorbing component can be the same or different; wherein the total thickness of all coatings present on the first surface is T and further wherein $S \geqq 2T$ is described.

20 Claims, No Drawings

ELEMENT AND PROCESS FOR LASER-INDUCED ABLATIVE TRANSFER UTILIZING PARTICULATE FILLER

This is a continuation of application Ser. No. 08/233,840 filed Apr. 26, 1994, now abandoned.

FIELD OF THIS INVENTION

This invention relates to an element and process for laser-induced ablative transfer. More particularly, this invention relates to (a) a donor element comprising a support and at least one transfer coating provided thereon and (b) a receiver element wherein upon exposing imagewise the donor or receiver element to laser radiation, a portion of the donor element is transferred to the receiver element and upon separation, an image having enhanced solid uniformity is obtained.

BACKGROUND OF THE INVENTION

Laser-induced thermal transfer processes are well-known in applications such as color proofing and lithography. Such laser-induced processes include, for example, dye sublimation, dye transfer, melt transfer, and ablative material transfer. These processes have been described in for example, Baldock, UK Patent 2,083,726; DeBoer, U.S. Pat. No. 4,942,141; Kellogg, U.S. Pat. No. 5,019,549; Evans, U.S. Pat. No. 4,948,776; Foley et al., U.S. Pat. No. 5,156,938; Ellis et al., U.S. Pat. No. 5,171,650; and Koshizuka et al., U.S. Pat. No. 4,643,917.

Laser-induced processes use a laserable assemblage comprising (a) a donor element that contains the imageable component, i.e., the material to be transferred, and (b) a receiver element. The donor element is imagewise exposed by a laser, usually an infrared laser, resulting in transfer of material to the receiver element. The exposure takes place only in a small, selected region of the donor at one time, so that the transfer can be built up one pixel at a time. Computer control produces transfer with high resolution and at high speed.

For the preparation of images for proofing applications, the imageable component is a colorant. For the preparation of lithographic printing plates, the imageable component is an oleophilic material which will receive and transfer ink in printing.

Hotta et al., U.S. Pat. No. 4,541,830, disclose the inclusion of nonsublimable particles in the dye layer of a dye transfer sheet used in a dye sublimation process. In a dye sublimation transfer process, the material being transferred is a gas, i.e., the subliming dye. DeBoer, U.S. Pat. No. 4,772,582, discloses that a separate layer of "spacer beads" should be used in such transfer elements.

A dye sublimation process is quite different from a laser ablative transfer process. In a dye sublimation process, an imageable component is converted into gaseous form and transferred via condensation onto the receiver surface. In an ablative transfer process, an imageable component is transferred as a solid material by an explosive force onto the receiver element. The mechanisms by which the transfer is effected are very different in the two processes. Factors which improve transfer in one process will not necessarily be applicable in the other process. As previously mentioned, such processes have been described in, e.g., Foley et al., U.S. Pat. No. 5,156,938, and Ellis et al., U.S. Pat. No. 5,171,650. These processes are fast and result in transfer of material with high resolution. However, it has been found that the solid image uniformity is frequently poor. Large solid images have a mottled or striated appearance which is generally unacceptable in proofing applications and in the printing industry.

SUMMARY OF THE INVENTION

This invention provides a donor element for use in a laser-induced ablative transfer process:

(a) a support bearing on a first surface thereof (b) at least one coating comprising:

(i) a non-sublimable imageable component, (ii) a laser-radiation absorbing component, (iii) a particulate filler having an average particle size S, and (iv) optionally, a binder, wherein the non-sublimable imageable component and the laser-radiation absorbing component can be the same or different, wherein the total thickness of all coatings present on the first surface is T; and further wherein $S \geqq 2T$.

In a second embodiment this invention concerns a laser-induced ablative transfer process comprising:

(1) imagewise exposing to laser radiation a laserable assemblage comprising:

(A) a donor element comprising (a) a support bearing on a first surface thereof, (b) at least one coating comprising:

(i) a non-sublimable imageable component, (ii) a laser-radiation absorbing component, (iii) a particulate filler having an average particle size S, and (iv) optionally, a binder, wherein the non-sublimable imageable component and the laser-radiation absorbing component can be the same or different, wherein the total thickness of all the coatings on the first surface of the support is T, and further wherein $S \geqq 2T$; and (B) a receiver element situated proximally to the first surface of the donor element, wherein a substantial portion of (i) is transferred to the receiver element by ablative transfer;

(2) separating the donor element from the receiver element. Steps (1)–(2) can be repeated at least once using the same receiver element and a different donor element having an imageable component the same as or different from the first imageable component.

DETAILED DESCRIPTION OF THE INVENTION

This invention concerns a process for laser-induced ablative transfer, and an element for use in such a process. The process provides good density transfer of the non-sublimable imageable component onto the receiver element with good solid image uniformity. By "solid image uniformity" it is meant the uniformity of the material transferred in solid pattern areas regardless of the application, i.e., for color proofs, lithographic printing plates, and other applications. The element comprises a transfer coating which includes particulate material having an average particle size at least twice as great as the total thickness of all the coatings on that side of the support.

Surprisingly and unexpectedly, it was found that the inclusion of particulate material improves the transfer of a solid, nonsublimable imageable component in an ablative type transfer process. It was further surprising that the inclusion of the particulate material in the transfer layer itself, rather than in a separate layer, could have such an effect.

Donor Element

The donor element comprises a support bearing on a first surface thereof, a transfer coating comprising (i) a non-sublimable imageable component, (ii) a laser-radiation absorbing component, (iii) a particulate filler, and (iv) optionally, a binder. The imageable component and the laser-radiation absorbing component can be the same or different. The average particle size of the particulate filler is at least twice the total thickness of the coatings on that side of the support. The transfer coating can consist of a single layer, or multiple layers, having components (i)–(iv).

1. Support

Any dimensionally stable, sheet material can be used as the donor support. When the laserable assemblage is to be imaged through the donor support, the support should also be capable of transmitting the laser radiation, and not be adversely affected by this radiation. Examples of suitable materials include, for example, polyesters, such as polyethylene terephthalate and polyethylene naphthanate; polyamides; polycarbonates; fluoropolymers; polyacetals; polyolefins; etc. A preferred support material is polyethylene terephthalate film. The donor support typically has a thickness of about 2 to about 250 micrometers, and can have a subbing layer, if desired. A preferred thickness is about 10 to 50 micrometers.

2. Transfer Coating

The transfer coating comprises (i) a non-sublimable imageable component, (ii) a laser-radiation absorbing component, (iii) a particulate filler, and (iv) optionally, a binder.

The nature of the imageable component will depend on the intended application for the assemblage. For imaging applications, the imageable component will be a colorant. The colorant can be a pigment or a non-sublimable dye. It is preferred to use a pigment as the colorant because pigments are more stable and provide for better color density. Examples of suitable inorganic pigments include carbon black and graphite. Examples of suitable organic pigments include Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monastral® Blue G (C.I. No. Pigment Blue 15); Monastral® Blue BT 383D (C.I. No. Pigment Blue 15); Monastra® Blue G BT 284D (C.I. No. Pigment Blue 15); and Monastral® Green GT 751D (C.I. No. Pigment Green 7). Combinations of pigments and/or dyes can also be used.

In accordance with principles well known to those skilled in the art, the concentration of colorant will be chosen to achieve the optical density desired in the final image. The amount of colorant will depend on the thickness of the active coating and the absorption of the colorant. Optical densities greater than 2 at the wavelength of maximum absorption (greater than 99% of incident light absorbed) are typically required.

A dispersant is usually present when a pigment is to be transferred, in order to achieve maximum color strength, transparency and gloss. The dispersant is generally an organic polymeric compound and is used to separate the fine pigment particles and avoid flocculation and agglomeration. A wide range of dispersants is commercially available. A dispersant will be selected according to the characteristics of the pigment surface and other components in the composition as practiced by those skilled in the art. However, dispersants suitable for practicing the invention are the AB dispersants. The A segment of the dispersant adsorbs onto the surface of the pigment. The B segment extends into the solvent into which the pigment is dispersed. The B segment provides a barrier between pigment particles to counteract the attractive forces of the particles, and thus to prevent agglomeration. The B segment should have good compatibility with the solvent used. The AB dispersants of choice are generally described in "Use of AB Block Polymers as Dispersants for Non-aqueous Coating Systems", by H. C. Jakubauskas, Journal of Coating Technology, Vol. 58, No. 736, pages 71–82. Suitable AB dispersants are also disclosed in U.K. Patent 1,339,930 and U.S. Pat. Nos. 3,684,771; 3,788,996; 4,070,388; 4,912,019; and 4,032,698. Conventional pigment dispersing techniques, such as ball milling, sand milling, etc., can be employed.

For lithographic applications, the imageable component is an oleophilic, ink-receptive material. The oleophilic material is usually a film-forming polymeric material. Examples of suitable oleophilic materials include polymers and copolymers of acrylates and methacrylates; polyolefins; polyurethanes; polyesters; polyaramids; epoxy resins; novolak resins; and combinations thereof. Preferred oleophilic materials are acrylic polymers.

In lithographic applications, a colorant can also be present. The colorant facilitates inspection of the plate after it is made. Any of the colorants discussed above can be used. The colorant can be a heat-, light-, or acid-sensitive color former. The colorant can be in a layer that is the same as or different from the layer containing the oleophilic material.

In general, for both color proofing and lithographic printing applications, the imageable component is present in an amount of from about 35 to 95% by weight, based on the total weight of the transfer coating. For color proofing applications, the amount of imageable component is preferably 45–65% by weight; and for lithographic printing applications, preferably 65–85% by weight.

Although the above discussion was limited to color proofing and lithographic printing applications, the element and process of the invention apply equally to the transfer of other types of imageable components in different applications. In general, the scope of the invention is intended to include any application in which solid material is to be applied to a receptor in a pattern. Examples of other suitable imageable components include, but are not limited to, magnetic materials, fluorescent materials, and electrically conducting materials.

The imageable component can also function as a laser radiation absorbing component, however, in most cases it is desirable to have a separate laser radiation absorbing component present in the donor element. The component can comprise finely divided particles of metals such as aluminum, copper or zinc, or one of the dark inorganic pigments, such as carbon black or graphite. However, the component is preferably an infrared absorbing dye. Suitable dyes which can be used alone or in combination include poly(substituted)phthalocyanine compounds and metal-containing phthalocyanine compounds; cyanine dyes; squarylium dyes; chalcogenopyryloarylidene dyes; croconium dyes; metal thiolate dyes; bis(chalcogenopyrylo)polymethine dyes; oxyindolizine dyes; bis(aminoaryl)polymethine dyes; merocyanine dyes; and quinoid dyes. Infrared-absorbing materials for laser-induced thermal imaging have been disclosed, for example, by: Barlow, U.S. Pat. No. 4,778,128; DeBoer, U.S. Pat. Nos. 4,942,141, 4,948,778, and 4,950,639; Kellogg, U.S. Pat. No. 5,019,549; Evans, U.S. Pat. Nos. 4,948,776 and 4,948,777; and Chapman, U.S. Pat. No. 4,952,552.

When present, the laser-radiation absorbing component generally has a concentration of about 1 to 15% by weight, based on the total weight of the transfer coating; preferably 5–10% by weight.

The particulate filler is present in the coating to provide a spacing between the donor support and the receiving layer. In order to act as a spacer, the particulate filler should have an average particle size at least twice as large as the total thickness of the coatings on that side of the support. By "average particle size" it is meant that the average diameter of spherical or nearly spherical particles or the average effective diameter for nonspherical particles is within the range of 1–10 micrometers depending on the coating thickness. Methods for measuring particle size are well known in the art. For example, instruments such as a Malvern 3600 particle size analyzer can be used or the particle size can be measured as the percentage passing through a certian size mesh. It is preferable that the particle size not exceed 10 micrometers so that the particulate material does not introduce visible artifacts during transfer. A preferred range for the particle size is about 3 to 10 micrometers, most preferably about 3 to 5 micrometers.

The particulate filler should be nonreactive, i.e., it should not absorb the laser radiation or interact with any of the other components in the transfer coating or receiver element. For color proofing applications, the particulate filler should also be colorless. The particulate filler can be inorganic particles or polymeric resin particles. Examples of suitable particulate materials include metal oxides such as alumina, silica; alloys of alumina and silica; colorless inorganic salts; polymers such as polystyrene, phenol resins, melamine resins, epoxy resins, silicone resins, polyethylene, polypropylene, polyesters, fluoropolymers and polyimides; insoluble organic substances, such as salts of acidic polymeric materials; and mixtures thereof.

As the amount of particulate filler present in the transfer coating is increased, in general, the solid image uniformity improves. At the same time, it dilutes or reduces the amount of material transferred, i.e., decreases the transfer density. Therefore, it is necessary to balance these two effects such that the solid image uniformity is improved without a significant decrease in transferred density. For color proofing applications, it has been found that 3–25% by weight particulate filler, based on the total weight of the transfer coating, is satisfactory; 5–15% by weight particulate filler, based on the total weight of the transfer coating, is preferred. For lithographic printing applications, it has been found that 3–40% by weight particulate filler, based on the total weight of the transfer coating, is satisfactory; 20–35% by weight particulate filler, based on the total weight of the transfer coating, is preferred.

Other ingredients, for example, binders, surfactants, coating aids and plasticizers, can be present in the transfer coating, provided that they are compatible with the other ingredients and do not adversely affect the properties of the assemblage in the practice of the process of the invention. For color proofing applications, the additives should not impart unwanted color to the image. For lithographic printing applications, the additives should not adversely affect the oleophilic properties of the transferred material.

In most lithographic printing applications, the imageable component, i.e., oleophilic material, functions as a binder and no additional binder is needed. For color proofing and other applications, a binder is generally added as a vehicle for the imageable component and to give the coating integrity. The binder is generally a polymeric material. It should be of sufficiently high molecular weight so that it is film-forming, yet of sufficiently low molecular weight so that it is soluble in the coating solvent. The binder can be self-oxidizing or non-self-oxidizing. Examples of suitable binders include, but are not limited to cellulose derivatives, such as, cellulose acetate, cellulose triacetate, cellulose acetate butyrate, cellulose acetate propionate, cellulose acetate hydrogen phthalate, nitrocellulose; polyacetals, such as polyvinyl butyral; acrylate and methacrylate polymers and copolymers; acrylic and methacrylic acid polymers and copolymers; polycarbonate; copolymers of styrene and acrylonitrile; polysulfones; polyurethanes; polyesters; polyorthoesters; and poly(phenylene oxide).

The binder, when present, generally has a concentration of about 15–50% by weight, based on the total weight of the transfer coating, preferably 30–40% by weight. The binder can be used at a coating weight of about 0.1 to about 5 $g/m^2$.

Plasticizers are well known and numerous examples can be found in the art. These include, for example, acetate esters of glycerine; polyesters of phthalic, adipic and benzoic acids; ethoxylated alcohols and phenols and the like. Monomers and low molecular weight oligomers can also be used.

It is preferred that the composition for the transfer coating be contained in a single layer. However, the composition can also be contained in multiple layers coated on the same side of the support. The imageable component, laser radiation absorbing component, and particulate filler can be in separate layers, or variously combined into two or more layers. Each of these layers can have a binder, the binders for each layer being the same or different. In general, the layer containing the imageable component will be outermost from the support.

The layer(s) can be coated onto the donor support as a dispersion in a suitable solvent, however, it is preferred to coat the layer(s) from a solution. Any suitable solvent can be used as a coating solvent, as long as it does not deleteriously affect the properties of the assemblage, using conventional coating techniques or printing techniques, for example, gravure printing.

The donor element can have additional layers as well other than the transfer coating layer(s). For example, an antihalation layer can be coated on the side of the support opposite the transfer coating. Materials which can be used as antihalation agents are well known in the art. In addition, the donor element can have a laser radiation-absorbing intermediate layer between the support and the transfer coating layer(s). Suitable intermediate layers have been described in Ellis et al., U.S. Pat. No. 5,171,650, including low melting thin metal films.

As discussed above, the total thickness of all the coatings on the first surface of the support, i.e., the layer(s) which comprise the transfer coating plus any additional layers on that side of the support, is T. The relationship between total coating thickness and the particle size of the filler is $S \geqq 2T$.

Receiver Element

2. Receiver Element

The receiver element is situated proximally to the first surface of the donor element. By "proximally" it is meant that the donor and receiver element are adjoined or in intimate contact with one another.

The receiver element typically comprises a receptor support and, optionally, an image-receiving layer. The receptor support comprises a dimensionally stable sheet material. The assemblage can be imaged through the receptor support if that support is transparent. Examples of transparent films include, for example polyethylene terephthalate, polyether sulfone, a polyimide, a poly(vinyl alcohol-co-acetal), or a cellulose ester, such as cellulose acetate. Examples of opaque supports materials include, for example, polyethylene terephthalate filled with a white pigment such as titanium dioxide, ivory paper, or synthetic paper, such as Tyvek® spunbonded polyolefin. Paper supports are preferred for proofing applications. For lithographic printing applications, the support is typically a thin sheet of aluminum, such as anodized aluminum, or polyester.

Although the imageable component can be transferred directly to the receptor support, the receiver element may have an additional receiving layer on one surface thereof. For image formation applications, the receiving layer can be a coating of, for example, a polycarbonate, a polyurethane, a polyester, polvinyl chloride, styrene/acrylonitrile copolymer, poly(caprolactone), and mixtures thereof. This image receiving layer can be present in any amount effective for the intended purpose. In general, good results have been obtained at coating weights of about 0.5 to about 4.2 micrometers. For lithographic applications, typically the aluminum sheet is treated to form a layer of anodized aluminum on the surface as a receptor layer. Such treatments are well known in the lithographic art.

It is also possible that the receiver element is not the final intended support for the imageable component. In other words, the receiver element can be an intermediate element and the laser imaging step can be followed by one or more transfer steps by which the imageable component is transferred to the final support. This is most likely applicable to multicolor proofing applications in which a multicolored image is built up on the receiver element and then transferred to a permanent paper support.

Process Steps

1. Exposure

The first step in the process of the invention is imagewise exposing the laserable assemblage to laser radiation. The laserable assemblage comprises the donor element and the receiver element, described above.

The assemblage is prepared by placing the donor and receiver elements in contact together such that the transfer coating is touching the receiver element or the receiving layer on the receiver element. Significant vacuum or pressure should not be used to hold the two elements together. In some cases, the adhesive properties of the receiver and donor elements alone is sufficient to hold the elements together. Alternatively, the donor and receiver elements can be taped together and taped to the imaging apparatus. A pin/clamping system can also be used. The laserable assemblage can be conveniently mounted on a drum to facilitate laser imaging.

Various types of lasers can be used to expose the laserable assemblage. The laser is preferably one emitting in the infrared, near-infrared or visible region. Particularly advantageous are diode lasers emitting in the region of 750 to 870 nm. Diode lasers offer substantial advantages such as their small size, low cost, stability, reliability, ruggedness and ease of modulation. Diode lasers emitting in the range of 800 to 830 nm are most preferred. Such lasers are available from, for example, Spectra Diode Laboratories (San Jose, Calif.).

The exposure can take place through the support of the donor element or through the receiver element, provided that these are substantially transparent to the laser radiation. In most cases, the donor support will be a film which is transparent to infrared radiation and the exposure is conveniently carried out through the support. However, if the receiver element is substantially transparent to infrared radiation, the process of the invention can also be carried out by imagewise exposing the receiver element to infrared laser radiation.

The laserable assemblage is exposed imagewise so that the imageable component is transferred to the receiver element in a pattern. The pattern itself can be, for example, in the form of dots or linework generated by a computer, in a form obtained by scanning artwork to be copied, in the form of a digitized image taken from original artwork, or a combination of any of these forms which can be electronically combined on a computer prior to laser exposure. The laser beam and the laserable assemblage are in constant motion with respect of each other, such that each minute area of the assemblage ("pixel") is individually addressed by the laser. This is generally accomplished by mounting the laserable assemblage on a rotatable drum. A flat bed recorder can also be used.

2. Separation

The next step in the process of the invention is separating the donor element from the receiver element. Usually this is done by simply peeling the two elements apart. This generally requires very little peel force, and is accomplished by simply separating the donor support from the receiver element. This can be done using any conventional separation techniques and can be manual or automatic without operator intervention.

EXAMPLES

Glossary

| | |
|---|---|
| Binder 1 | Poly (1-lactic acid) |
| Binder 2 | Poly (alpha-methylstyrene) |
| Binder 3 | Elvacite ® 2014 (E. I. duPont de Nemours and Company, Wilmington, DE) |
| Binder 4 | Poly (tetrahydropyranyl methacrylate) |
| Binder 5 | Oleophilic imageable component, carboxylated polyvinyl-butyral(polyvinyl-butyral esterified with phthalic anhydride) |
| Dispersant | AB dispersant |
| Filler 1 | Zeospheres X-61, silica-alumina alloy, particle size 3.0 μm (Zeelan Industries, St. Paul, MN) |
| Filler 2 | Zeospheres X-75, silica-alumina alloy particle size 3.5 μm (Zeelan Industries, St. Paul, MN) |
| Filler 3 | P-5000, silica particle size 10.0 μm (Potter Industries, Parsippany, NJ) |
| Filler 4 | DSO-19, diazonium resin tosylate 4-30 microns particle size (Produits Chimiques Auxiliaires et de Synthese) |
| Pigment 1 | cyan pigment, Heubach Heucopthal ® Blue G, (Cookson Pigments, Newark, NJ) |
| Pigment 2 | magenta pigment, Hoechst Permanent Rubine Red F6B (Hoechst Celanese, Sommerville, |

-continued

| EXAMPLES | |
|---|---|
| Glossary | |
| | NJ) |
| Pigment 3 | yellow pigment, Hoechst Permanent Yellow GG, (Hoechst Celanese, Sommerville, NJ) |
| Pigment 4 | black pigment, Regal 660, pelletized (Cabot Corp., Waltham, MA) |
| SQS | 4-[3-[2,6-Bis(1,10-dimethyl-ethyl)-4H-thiopyran-4-ylidene]methyl]-2-hydroxy-4-oxo-2-cyclobuten-1-ylidene]methyl-2,6-bis(1,1-diethylethyl)-thiopyrilium hydroxide, inner salt |

In the examples which follow, "coating solution" refers to the mixture of solvent and additives which is coated on the support. The term encompasses both true solutions and dispersions. Amounts are expressed in parts by weight, unless otherwise specified.

General Procedure

The components of the coating solution were combined in an amber glass bottle and rolled overnight to ensure complete mixing. When a pigment was used as the colorant, it was first mixed with the dispersant in a solvent on an attritor with steel balls for approximately 20 hours, and then added to the rest of the transfer coating composition. The mixed solution was then coated onto a 4 mil (0.010 cm) thick sheet of Mylar® polyester film (E. I. du Pont de Nemours and Company, Wilmington, Del.). The coating was air dried to form a donor element having a transfer coating with a dry thickness in the range from 0.3 to 2.0 micrometers depending on percent solids of the formulation and the blade used to coat the formulation onto the plate.

Two types of laser imaging apparatuses were used. The first was a Crosfield Magnascan 646 (Crosfield Electronics, Ltd., London, England) which had been retrofitted with a CREO writehead (Creo Corp., Vancouver, BC) using an array of 36 infrared lasers emitting at 830 nm (SDL-7032-102 from Sanyo Semiconductor, Allendale, N.J.). The second type was a Creo Plotter (Creo Corp., Vancouver, BC) having 32 infrared lasers emitting at 830 nm. The receptor element was first taped to the drum of either one of the laser imaging apparatus. The donor element was then laid over the receptor with the transfer coating facing the receptor, pulled tight, and also taped in place. The film was then exposed over a 1–2 cm area at varying rpms to transfer the imageable component to the receptor.

After laser imaging, the tape was removed and the donor element was separated from the receiver element.

The imaged receiver element was then evaluated visually and rated according to the following scale:

0=excellent, no mottle

1=good, slight mottle

2=fair, moderate mottle

3=poor, considerable mottle

EXAMPLE 1

This example illustrates the use of different particulate fillers at different loading levels in the element and process of the invention.

The following coating solutions were prepared as 25% solids in a solvent of methylene chloride:

TABLE 1

| | % Solids | | | | | | | |
|---|---|---|---|---|---|---|---|---|
| Component | Control 1 | 1A | 1B | 1C | 1D | 1Ef | 1F | 1G |
| Pigment 1 | 49 | 49 | 49 | 49 | 49 | 49 | 49 | 49 |
| SQS | 5 | 5 | 5 | 5 | 5 | 5 | 5 | 5 |
| Filler 1 | | 5 | 10 | 15 | 20 | 25 | | |
| Filler 2 | | | | | | | 5 | 10 |
| Filler 3 | | | | | | | | |
| Binder 1 | 25 | 20 | 15 | 10 | 5 | 0 | 20 | 15 |
| Dispersant | 21 | 21 | 21 | 21 | 21 | 21 | 21 | 21 |
| | IH | 1I | 1J | 1K | 1L | 1M | 1N | 1O |
| Pigment 1 | 49 | 49 | 49 | 49 | 49 | 49 | 49 | 49 |
| SQS | 5 | 5 | 5 | 5 | 5 | 5 | 5 | 5 |
| Filler 1 | | | | | | | | |
| Filler 2 | 15 | 20 | 25 | | | | | |
| Filler 3 | | | | 5 | 10 | 15 | 20 | 25 |
| Binder 1 | 10 | 5 | 0 | 20 | 15 | 10 | 5 | 0 |
| Dispersant | 21 | 21 | 21 | 21 | 21 | 21 | 21 | 21 |

The coating solutions were coated onto Mylar® polyester film to form a dry transfer coating approximately 0.6 micrometers thick, to form donor elements.

The receptor was LOE (Lustro Gloss, manufactured by Warner Paper, Westbrook, Me.) paper.

The donor and receptors were imaged on the Creo plotter at a fluence level of approximately 300 $mJ/cm^2$.

The resulting solid image uniformity is given in Table 2 below, which clearly shows the superior performance of the elements prepared using the process of the invention.

TABLE 2

| Sample | Rating | Sample | Rating |
|---|---|---|---|
| Control 1 | 3 | 1H | 0 |
| 1A | 1 | 1I | 0 |
| 1B | 1 | 1J | 0 |
| 1C | 1 | 1K | 1 |
| 1D | 0 | 1L | 1 |
| 1E | 0 | 1M | 0 |
| 1F | 1 | 1N | 0 |
| 1G | 1 | 1O | 0 |

EXAMPLE 2

The following coating solutions were prepared as 8% solids in a solvent mixture of methyl ethyl ketone, 2-pentanone, n-butyl acetate, and cyclohexanone (50/20/15/15 by weight):

| | % Solids | |
|---|---|---|
| Component | Control 2 | Sample 2 |
| Pigment 2 | 67 | 60.9 |
| SQS | 5 | 4.5 |
| Filler 2 | 0 | 9.1 |
| Binder 2 | 28 | 25.5 |

The coating solutions were coated to form donor elements and imaged as described in Example 1.

Control 2 was rated 3.

Sample 2 was rated 0.

EXAMPLE 3

This example illustrates the use of the elements and process of the invention to form a four-color proof.

The following coating solutions were prepared as 8% solids in the solvent of Example 2:

| | % Solids | | | |
|---|---|---|---|---|
| Component | 3A | 3B | 3C | 3D |
| Pigment 1 | 49 | | | |
| Pigment 2 | | 59.5 | | |
| Pigment 3 | | | 59.5 | |
| Pigment 4 | | | | 49 |
| SQS | 5 | 5 | 5 | 5 |
| Filler 2 | 10 | 10 | 10 | 10 |
| Binder 2 | | 25.5 | | |
| Binder 3 | 15 | | | 15 |
| Binder 4 | | | 25.5 | |
| Dispersant | 21 | | | 21 |

The coating solutions were coated as described in Example 1, to form donor elements. Using digital file input, the donor elements were sequentially imaged onto the same paper receiver element. The imaging step was carried out as in Example 1 except that each donor element used to make the four-color proof had a yellow magenta, cyan and black colorant, respectively.

The resulting four-color image had excellent uniformity, with no mottle, i.e., 0 rating.

EXAMPLE 4

This example illustrates the element and process of the invention to form a lithographic printing plate.

The following coating solutions were prepared as 8.25% solids in a solvent mixture of methyl ethyl ketone/n-butyl acetate/cyclohexanone (70/15/15 by weight):

| | % Solids | |
|---|---|---|
| Component | Control 4 | Sample 4 |
| Binder 5 | 95 | 62 |
| SQS | 5 | 5 |
| Filler 4 | 0 | 33 |

The solutions were coated onto 200D Mylar® film using a No. 3 wire rod at a 0.5–0.6 micrometer dry coating weight.

The receiver element was a sheet of grained and anodized aluminum, Imperial Type DE (Imperial Metal and Chemical Co., Philadelphia, Pa.).

The Crosfield apparatus was used for imaging with a fluence level of about 600 mJ/cm$^2$ in the overlap mode, using both 50% and 100% dot patterns.

With Control 4, there was no image transfer except for a mottled, melted-on image at 100% dots, i.e., 3 rating.

With Sample 4, there was excellent image transfer for 50% and 100% dots, without mottle, i.e., 0 rating.

What is claimed is:

1. An element for use in a laser-induced ablative transfer process, said element comprising:

(a) a support, bearing on a first surface thereof (b) at least one transfer coating comprising:

(i) a non-sublimable imageable component, (ii) a laser-radiation absorbing component, (iii) a particulate filler having an average particle size S, and wherein the non-sublimable imageable component and the laser-radiation absorbing component can be the same or different; wherein the coatings on the first surface of the support have a total thickness T; and further wherein S≧2T.

2. The element of claim 1 wherein the transfer coating comprises a single layer.

3. The element of claim 1 wherein the transfer coating further comprises (iv) a binder.

4. The element of claim 3 wherein the transfer coating comprises:

(i) 35–95% by weight non-sublimable imageable component, based on the total weight of the transfer coating, (ii) 1–15% by weight laser-radiation absorbing component, based on the total weight of the transfer coating, (iii) 3–40% by weight particulate filler, based on the total weight of the transfer coating; and (iv) 0–50% by weight binder, based on the total weight of the transfer coating.

5. The element of claim 3 wherein the non-sublimable imageable component comprises a pigment and the transfer coating comprises:

(i) 35–65% by weight non-sublimable imageable component, based on the total weight of the transfer coating, (ii) 1–15% by weight laser-radiation absorbing component, based on the total weight of the transfer coating, (iii) 3–25% by weight particulate filler, based on the total weight of the transfer coating; and (iv) 15–50% by weight binder, based on the total weight of the transfer coating.

6. The element of claim 1 wherein the non-sublimable imageable component comprises an oleophilic material and the transfer coating comprises:

(i) 50–95% by weight non-sublimable imageable component, based on the total weight of the transfer coating, (ii) 1–15% by weight laser-radiation absorbing component, based on the total weight of the transfer coating, and (iii) 3–40% by weight particulate filler, based on the total weight of the transfer coating.

7. The element of claim 1 wherein the particulate filler comprises a material selected from the group consisting of alumina, silica, alloys of alumina and silica, polypropylene, polyethylene, polyesters, fluoropolymers, polystyrene, phenol resins, melamine resins, epoxy resins, silicone resins, polyimides, salts of acidic polymeric materials, and mixtures thereof.

8. The element of claim 1 wherein the thickness T is from about 0.5 to 1.0 micrometers and the average particle size S is from about 3.0 to 30.0 micrometers.

9. The element of claim 8 wherein the thickness T is from about 0.5 to 1.0 micrometers and the average particle size S is 3.0 to 10.0 micrometers.

10. A laser-induced ablative transfer process which comprises:

(1) imagewise exposing to laser radiation a laserable assemblage comprising:

(A) a donor element comprising (a) a support bearing on a first surface thereof, (b) at least one transfer coating comprising:

(i) a non-sublimable imageable component, (ii) a laser-radiation absorbing component, (iii) a particulate filler having an average particle size S, and wherein the non-sublimable imageable component and the laser-radiation absorbing component can be the same or different; wherein the coatings on the first surface of the support have a total thickness T; and further wherein S≧2T; and (B) a receiver element situated proximally to the first surface of the donor element, wherein a substantial portion of the imageable component (i) is transferred to the receiver element by ablative transfer; and (2) separating the donor element from the receiver element.

11. The process of claim 10 wherein the transfer coating comprises a single layer.

12. The process of claim 10 wherein the particulate filler comprises a material selected from the group consisting of alumina, silica, alloys of alumina and silica, polypropylene, polyethylene, polyesters, fluoropolymers, polystyrene, phenol resins, melamine resins, epoxy resins, silicone resins, polyimides, salts of acidic polymeric materials, and mixtures thereof.

13. The process of claim 10 wherein the thickness T is from 0.5 to 1.0 micrometers and the average particle size S is from 3.0 to 30.0 micrometers.

14. The process of claim 13 wherein the thickness T is from 0.5 to 1.0 micrometers and the average particle size S is from 3.0 to 10.0 micrometers.

15. The process of claim 10 wherein the transfer coating further comprises (iv) a binder.

16. The process of claim 15 wherein the imageable component is a pigment and the transfer coating comprises:

(i) 35–65% by weight non-sublimable imageable component, based on the total weight of the transfer coating, (ii) 1–10% by weight laser-radiation absorbing component, based on the total weight of the transfer coating, (iii) 3–25% by weight particulate filler, based on the total weight of the transfer coating; and (iv) 15–50% by weight binder, based on the total weight of the transfer coating.

17. The process of claim 16 wherein steps (1)–( 2) are repeated at least once using the same receiver element and a different donor element having a pigment the same as or different from the first pigment.

18. The process of claim 16 wherein the receiver element is paper.

19. The process of claim 10 wherein the non-sublimable imageable component is an oleophilic material and the transfer coating comprises:

(i) 35–95% by weight non-sublimable imageable component, based on the total weight of the transfer coating, (ii) 1–10% by weight laser-radiation absorbing component, based on the total weight of the transfer coating, and (iii) 3–25% by weight particulate filler, based on the total weight of the transfer coating.

20. The process of claim 19 wherein the receiver element is anodized aluminum.

* * * * *